(12) United States Patent
Dobashi et al.

(10) Patent No.: US 7,060,961 B2
(45) Date of Patent: Jun. 13, 2006

(54) IMAGE SENSING ELEMENT AND OPTICAL INSTRUMENT HAVING IMPROVED INCIDENT LIGHT USE EFFICIENCY

(75) Inventors: Hideki Dobashi, Tokyo (JP); Akihiko Nagano, Chiba-ken (JP); Kouichirou Okumura, Kanagawa-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/009,294

(22) Filed: Dec. 10, 2004

(65) Prior Publication Data

US 2005/0139750 A1    Jun. 30, 2005

(30) Foreign Application Priority Data

| Dec. 12, 2003 | (JP) | ............................. 2003-414029 |
| Dec. 12, 2003 | (JP) | ............................. 2003-414030 |
| Mar. 9, 2004 | (JP) | ............................. 2004-066293 |

(51) Int. Cl.
*H01J 40/14* (2006.01)
*H01J 3/14* (2006.01)
*H01J 5/16* (2006.01)
*H01L 27/00* (2006.01)

(52) U.S. Cl. ................... 250/216; 250/208.1; 358/474; 359/504

(58) Field of Classification Search ............ 250/208.1, 250/216, 239, 214.1, 214 R; 257/292, 294, 257/431–432; 358/474, 484, 505; 359/504, 359/726, 846
See application file for complete search history.

(56) References Cited

U.S. PATENT DOCUMENTS

| 6,008,511 A  * | 12/1999 | Tokumitsu et al. .......... 257/232 |
| 6,583,433 B1 * | 6/2003 | Sugiyama et al. ..... 250/559.38 |
| 2004/0004668 A1 | 1/2004 | Namazue et al. ........... 348/340 |
| 2005/0072906 A1* | 4/2005 | Dobashi .................. 250/208.1 |
| 2005/0236553 A1* | 10/2005 | Noto et al. .............. 250/208.1 |

FOREIGN PATENT DOCUMENTS

| JP | 5-235313 A | 9/1993 |
| JP | 6-224398 A | 8/1994 |
| JP | 2600250 B2 | 1/1997 |
| JP | 10-229180 A | 8/1998 |

* cited by examiner

*Primary Examiner*—Stephone B. Allen
*Assistant Examiner*—Patrick J. Lee
(74) *Attorney, Agent, or Firm*—Fitzpatrick, Cella, Harper & Scinto

(57) ABSTRACT

An image sensing element having a high refractive index part that covers at least a portion of each of a plurality of photoelectric converters arranged in one or two dimensions and a low refractive index part provided on the periphery of the high refractive index part. The interface between the high refractive index part and the low refractive index part has a surface that is substantially parallel to the optical axis of an image sensing lens and a slanted surface having an angle that differs from that of the parallel surface. The slanted surface is disposed on a portion of a surface near the optical axis of the image sensing lens, the portion being on a side that light rays from the image sensing lens enters the image sensing element.

11 Claims, 20 Drawing Sheets

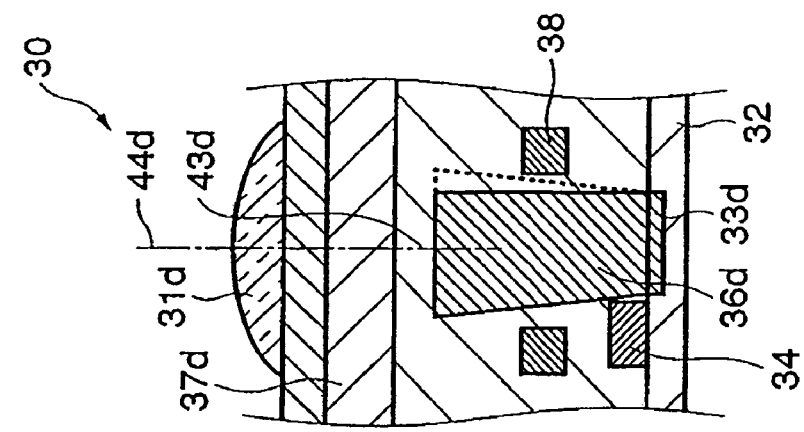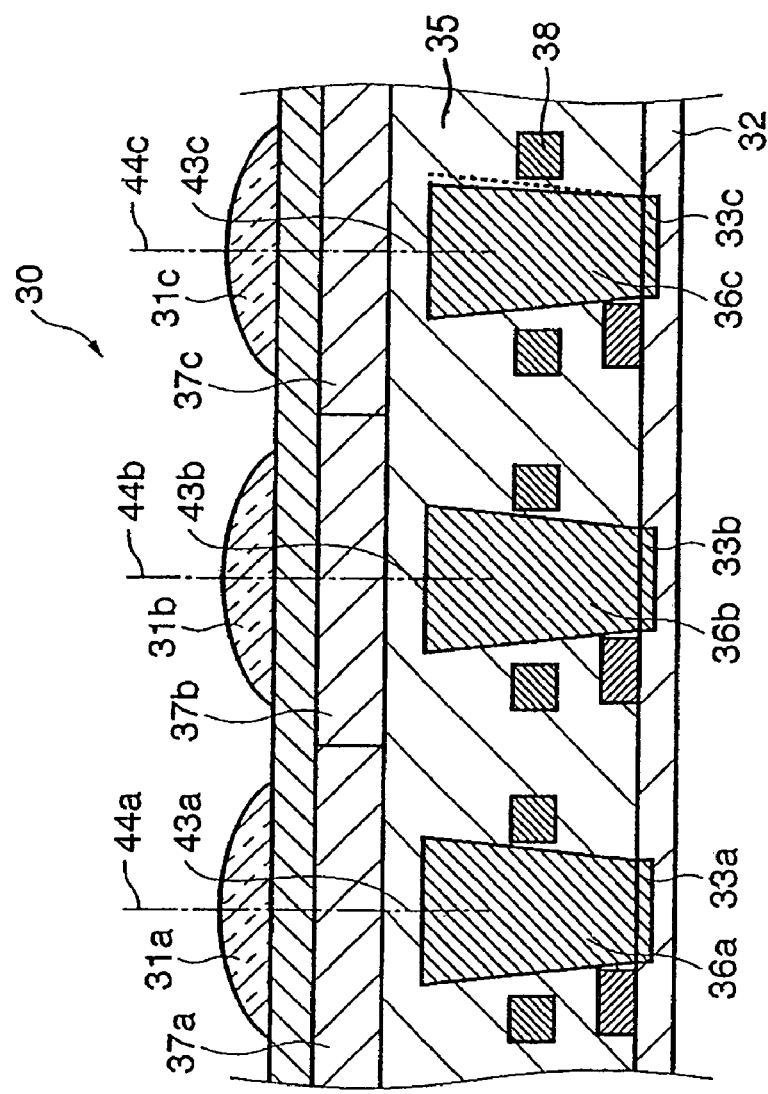

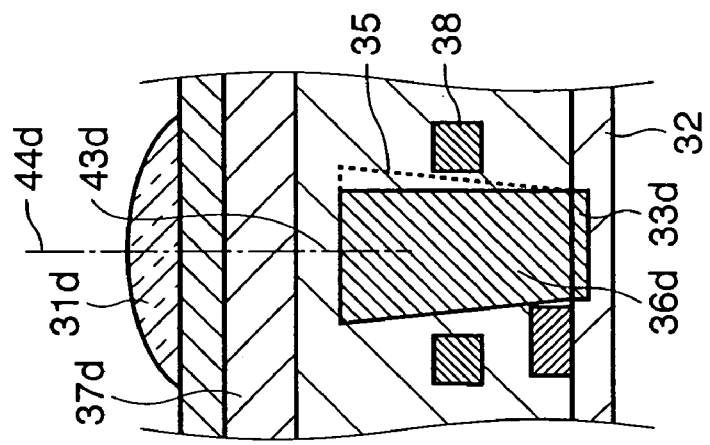
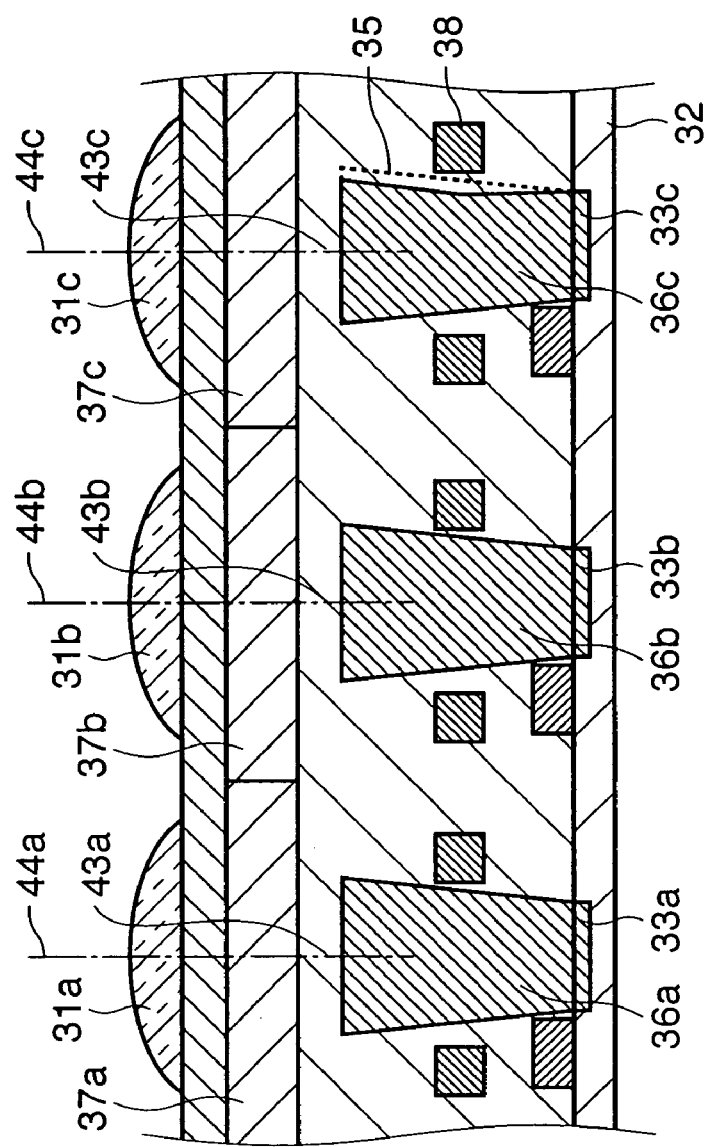

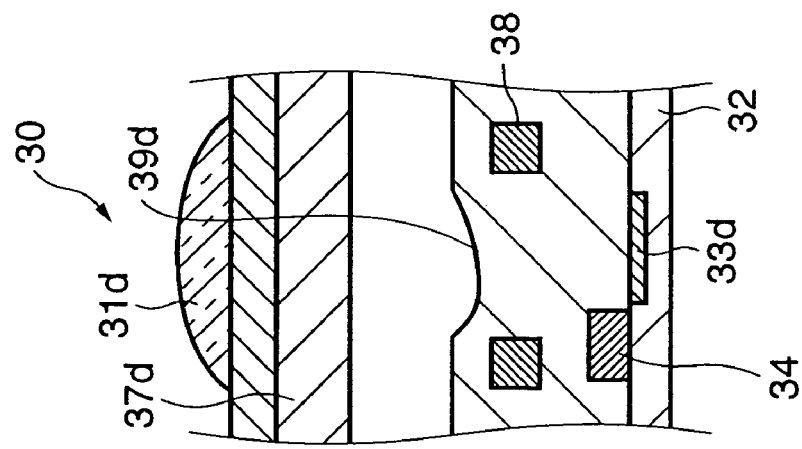
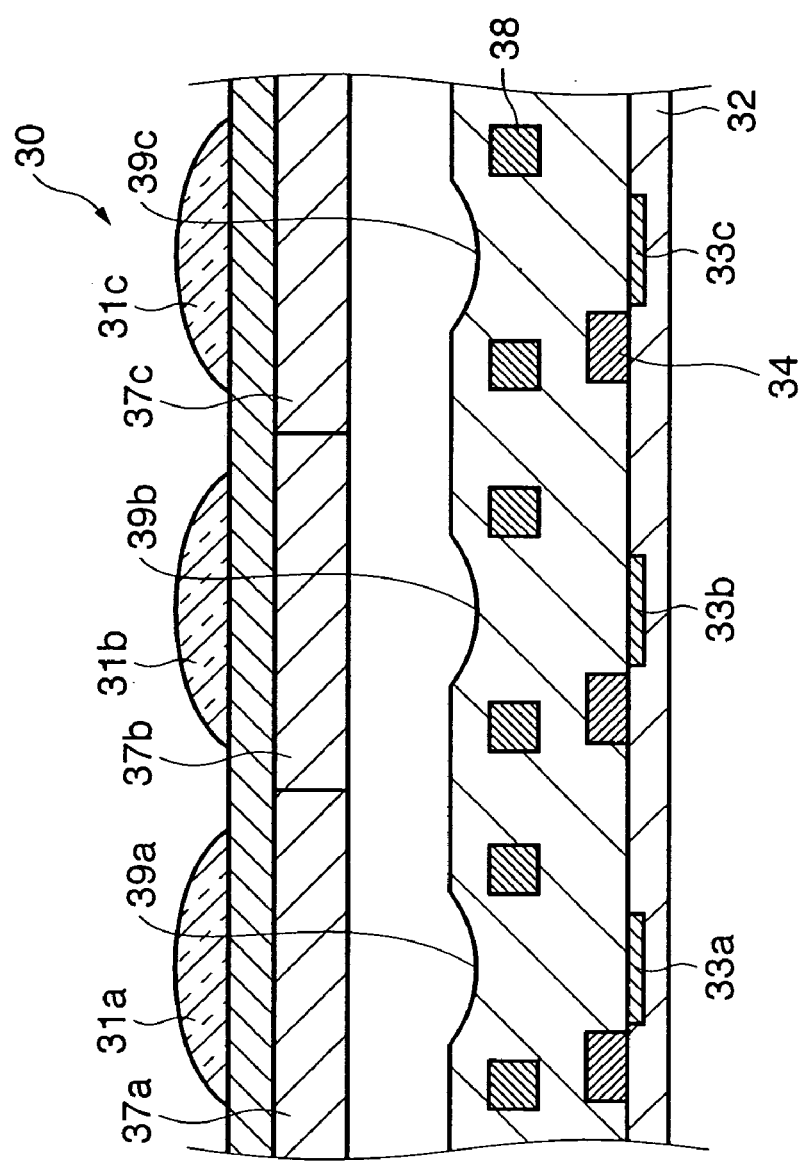

IMAGE SENSING ELEMENT AND OPTICAL INSTRUMENT HAVING IMPROVED INCIDENT LIGHT USE EFFICIENCY

FIELD OF THE INVENTION

The present invention relates to the internal structure of an image sensing element used in an image sensing apparatus such as a digital camera or the like and an optical instrument provided with the image sensing element, as well as a method of forming an asymmetrical light wave path used in the image sensing element.

BACKGROUND OF THE INVENTION

In order to improve the efficiency with which an image sensing element takes in light rays incident on the image sensing element (hereinafter "light-gathering efficiency"), an image sensing element adopting a structure like that described in Japanese Patent Application Laid-Open No. 10-229180 has been proposed. In the structure described in Japanese Patent Application Laid-Open No. 10-229180, as shown in FIGS. 14A–14C here, the surface of an image sensing element 25 is provided with a first microlens 21 and a second microlens 22, with FIG. 14B showing a pixel near the optical axis of an image sensing lens (in a central area 25c in FIG. 14A) and FIG. 14C showing a pixel at a position removed from the optical axis (in a periphery area 25a in FIG. 14A). The first microlens 21 is an in-layer lens consisting of a first lenticular film 12 provided atop a color filter film 11, with the top portion of the first lenticular film 12 formed into a convex shape. The second microlens 22 is formed by shaping a lenticular film 13 into a lens. An incidental light ray L concentrated by the second microlens 22 strikes the first microlens 21 (the in-layer lens), where the light ray further undergoes a convergence effect and is directed to a photoelectric converter. At this point, as the formation position of a given pixel approaches the periphery area 25a of the chip on which the image sensing element is set, the first and second microlenses 21, 22 are offset toward the center by distances t1, t2, respectively, so as to avoid degrading light-gathering efficiency at the periphery.

Moreover, a structure has been proposed that efficiently concentrates light striking at an angle at a photo-sensing portion by offsetting the optical axes of the microlenses (on-chip lenses) formed atop each photo-sensing portion toward the center of a solid-state image sensing element from the optical axes of the photo-sensing portions at the peripheral portion of the solid-state image sensing element (for example, Japanese Patent No. 2600250).

Moreover, in recent years, with the solid-state image sensing element used in such image sensing apparatuses as digital still cameras and the like, attempts have been made to improve image quality by increasing the number of pixels while at the same time reducing costs by reducing the size of the chip. Consequently, the size of a single pixel comprising a solid-state image sensing element has continued to shrink annually, as has the surface area of the photo-sensing portion thereof.

However, because photosensitivity declines as the surface area of the photo-sensing portion decreases, a variety of structures have been proposed in order to direct light rays striking the image sensing element to the photoelectric converter efficiently. As one example, there is the structure based on an embodiment described in Japanese Patent Application Laid-Open No. 06-224398, shown in FIG. 15. Reference numeral 65 designates a resin cap layer, formed of a material with a refractive index of approximately 1.6, and 64 designates a low refractive index layer, formed in a space filled with a resin of a refractive index lower than that of the cap layer 65, with air, or with an inert gas such as nitrogen. After providing a flattening layer 66 atop the previous two layers and flattening the surface, a microlens 62 is formed. The foregoing arrangement takes advantage of the fact that when a light ray traveling from the cap layer 65 toward the low refractive index layer 64 exceeds a critical angle the light ray is totally reflected at the interface between the two layers, thus totally reflecting slanting incident light 67 to a photoelectric converter 63.

Moreover, an image sensing element described in Japanese Patent Application Laid-Open No. 5-235313 is provided with a light wave path between a light incidence layer and the photo-sensing portion. This image sensing element improves light-gathering efficiency by providing a symmetrically shaped light wave path composed of a high refractive index material in the light incidence side of the photo-sensing portion and a low refractive index material around the periphery thereof, and totally reflecting the incident light at the interface between the two.

FIG. 16A is a cross-sectional view of a pixel arranged on the periphery of a solid-state image sensing element 30 likely to be obtained by combining the image sensing element described in Japanese Patent Application Laid-Open No. 5-235313 with Japanese Patent No. 2600250, showing light rays striking the image sensing element from an image sensing lens that is not shown. In FIG. 16A, reference numeral 31 designates a microlens for concentrating the incident light onto a photo-sensing portion 33, disposed at a position decentered toward the optical axis of the image sensing lens, not shown. A light wave path 36 composed of material of a high refractive index is formed on the light incidence side of the photo-sensing portion 33, and the incident light refracted by the microlens 31 is totally reflected at the interface between the light wave path 36 and an interlayer insulation portion 35 made of low refractive index material, and directed to the photo-sensing portion 33.

However, the conventional examples described above have the following problem shown in FIGS. 17 and 18. FIGS. 17A and 17B show a state in which a variable focal length image sensing lens array 202 is installed on an image sensing element 201, with FIG. 17A showing a wide angle state and FIG. 17B showing a telephoto state. The image sensing element 201 here is one used widely conventionally, in which the microlens is provided on the image sensing element surface, and it is assumed that no in-layer lens is present.

When an image sensing lens array changes from a wide-angle position to a telephoto position, the position of the pupil of the image sensing lens array 202 changes from T1 to T2. Looked at from the image sensing element 201, the rays of light passing through the lens and striking the image sensing element 201 can all be seen as emanating from the pupil position. The relation of the light rays originating from the pupil of the lens reaching the image sensing element is shown schematically in FIG. 18. Light rays passing through the image sensing lens array 202 and striking the photoelectric converter 3 from the wide angle pupil position in a pixel positioned at the lower left of an image sensing area that gathers in an image of an image sensing subject, when they arrive at the photoelectric converter 3, form an image 77 like that shown in FIG. 19. FIG. 19 shows a plan view of a single pixel, with the optical axis center of the image sensing lens positioned in the upper diagonal right of the diagram. By disposing the microlens provided on the image sensing element at a slight offset portion toward the optical axis of the image sensing lens, a pupil image appears atop the photoelectric converter 73 provided on a silicon wafer 71. Basically the pupil image 77 is formed at a location other than a Poly-Si wiring layer 78 that is present in order to switch electrical charges generated at the photoelectric converter 73, because the Poly-Si wiring layer 78 permits a certain number of light rays to pass but also absorbs many other light rays.

By contrast, when zooming to the telephoto side, the image 77 moves in a diagonally across the pixel as shown in FIG. 20. In a pixel positioned at the bottom of an image sensing area 203 shown in FIG. 18, if the angle formed by the light rays emanating from the center of the pupil and passing near the central axis of the microlens (main light rays) and the lens optical axis is θ1 at the wide-angle side and θ2 at the telephoto side, then the incident angle difference θ=θ1−θ2 generally tends to increase as the image sensing lens zoom ratio increases. In addition, the image sensing lens pupil diameter is determined by the brightness (F number) of the lens, and increases as the lens brightness increases. Accordingly, when the zoom ratio is increased the position of the image of the pupil occurring at the photoelectric converter 73 becomes markedly separated at the wide angle side and the telephoto side (that is, the incident angle difference increases), either overshooting the photoelectric converter or being eclipsed by an AL wiring layer 79. Moreover, as the lens brightens a larger image occurs at the photoelectric converter, thus further decreasing the number of light rays striking the photoelectric converter 73 and leading to a drastic decline in the light-gathering efficiency with which light rays entering the pixel are gathered by the photoelectric converter.

In the case of an optical instrument like that the pupil position does not change, that is, the focal distance is fixed (that is, a single focus lens) and the lens cannot be changed, the above-described problem can be solved by offsetting the microlens by an amount unique to that lens, so that the center of the pupil image is at the center of the photoelectric converter. However, in the case of an optical instrument in which the pupil position changes, such as a zoom lens or an interchangeable lens system, for reasons like those described above simply offsetting the microlens is not enough to solve the problem. The same problem arises with a structure having an in-layer lens (that is, the first microlens 21) like that shown in FIG. 14B, for example. In this case, the problem is that some of the light rays concentrated by the microlens do not strike the in-layer lens, or, if they do strike the in-player lens, they are not directed to the photoelectric converter, and consequently that portion of the light is lost.

Moreover, in the case of a structure like that shown in FIG. 15, because the interface between the high refractive index cap layer 65 and the low refractive index layer 64 forms an arc of small R, as the angle of incidence increases the light rays striking the arc pass through without being totally reflected and instead enter another pixel.

In addition, even with a camera in which a single focus lens is integrated into the body of the camera, if the image sensing lens is made smaller in order to reduce the size of the camera, the distance between the solid-state image sensing element and the image sensing lens exit pupil decreases, thus further increasing the angle at which light strikes the solid-state image sensing element. Consequently, with an image sensing element having a structure like that shown in FIG. 16A, as shown in the light trace diagram of FIG. 16B, with a solid-state image sensing element having the conventional symmetrical light wave path, beams of light that do not satisfy total reflection conditions arise at the refractive index interface and incident light cannot be concentrated efficiently.

Thus, as described above, the defect of the conventional art is that, because the angle of the light striking the solid-state image sensing element differs depending on the position of the pixels that comprise the solid-state image sensing element, the sensitivity varies according to the position of the pixel when light wave paths of the same shape are formed.

SUMMARY OF THE INVENTION

The present invention has been made in consideration of the above situation, and has as its object to provide an image sensing element and an optical instrument having improved incident light use efficiency regardless of the position of the pixel, even in an arrangement in which the image sensing lens pupil position changes considerably.

According to the present invention, the foregoing object is attained by providing an image sensing element comprising:

a high refractive index part that covers at least a portion of each of a plurality of photoelectric converters arrayed in one dimension or two dimensions; and a low refractive index part provided at a periphery of the high refractive index part, wherein an interface between the high refractive index part and the low refractive index part has a surface that is substantially parallel to the optical axis of an image sensing lens and a slanted surface of an angle different from that of the parallel surface, and the slanted surface is disposed on a portion of a surface near the optical axis of the image sensing lens, the portion being on a side that light rays from the image sensing lens enter the image sensing element.

According to the present invention, the foregoing object is also attained by providing a solid-state image sensing element composed of a plurality of pixels arranged on a projected image formation surface of an image sensing lens, each pixel comprising:

a microlens;

a photoelectric conversion unit that converts incident light into an electrical signal; and a light-directing unit composed of a transparent, high refractive index material, disposed between the microlens and the photoelectric conversion unit and directing light from the microlens to the photoelectric conversion unit, wherein the light-directing unit having a shape that differs depending on the position of each of the plurality of pixels in the solid-state image sensing element, such shape satisfying conditions for total reflection of light entering from the microlens within the light-directing unit.

According to the present invention, the foregoing object is also attained by providing a solid-state image sensing element composed of a plurality of pixels arranged on a projected image formation surface of an image sensing lens, each pixel comprising:

a microlens;

a photoelectric conversion unit that converts incident light into an electrical signal; and a light-directing unit composed of a transparent, high refractive index material, disposed between the microlens and the photoelectric conversion unit and directing light from the microlens to the photoelectric conversion unit, wherein the light-directing unit having a shape such that a curvature on a periphery side of the solid-state image sensing element decreases the farther the pixel is positioned from the center of the solid-state image sensing element, and of such shape and light-gathering power as to gather light entering from the microlens substantially entirely within the area of the photoelectric conversion unit.

Other features, objects and advantages of the present invention will be apparent from the following description when taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 8A and 8B are diagrams showing a schematic cross-sectional view of the structure of some pixels of the solid-state image sensing element shown in FIG. 2;

FIGS. 12A and 12B are diagrams showing a schematic cross-sectional view of a different structure of some pixels of the solid-state image sensing element shown in FIG. 7;

FIGS. 13A and 13B are diagrams showing a schematic cross-sectional view of the structure of some pixels of a solid-state image sensing element according to a third embodiment of the present invention;

DETAILED DESCRIPTION OF THE PREFERRED EMBODIMENTS

Preferred embodiments of the present invention will now be described in detail in accordance with the accompanying drawings. However, it should be noted that the dimensions, materials, shapes and relative positions of the constituent parts shown in the embodiments should be changed as convenient depending on various conditions and on the structure of the apparatus adapted to the invention, and the invention is not limited to the emboss described herein.

Figure 1:
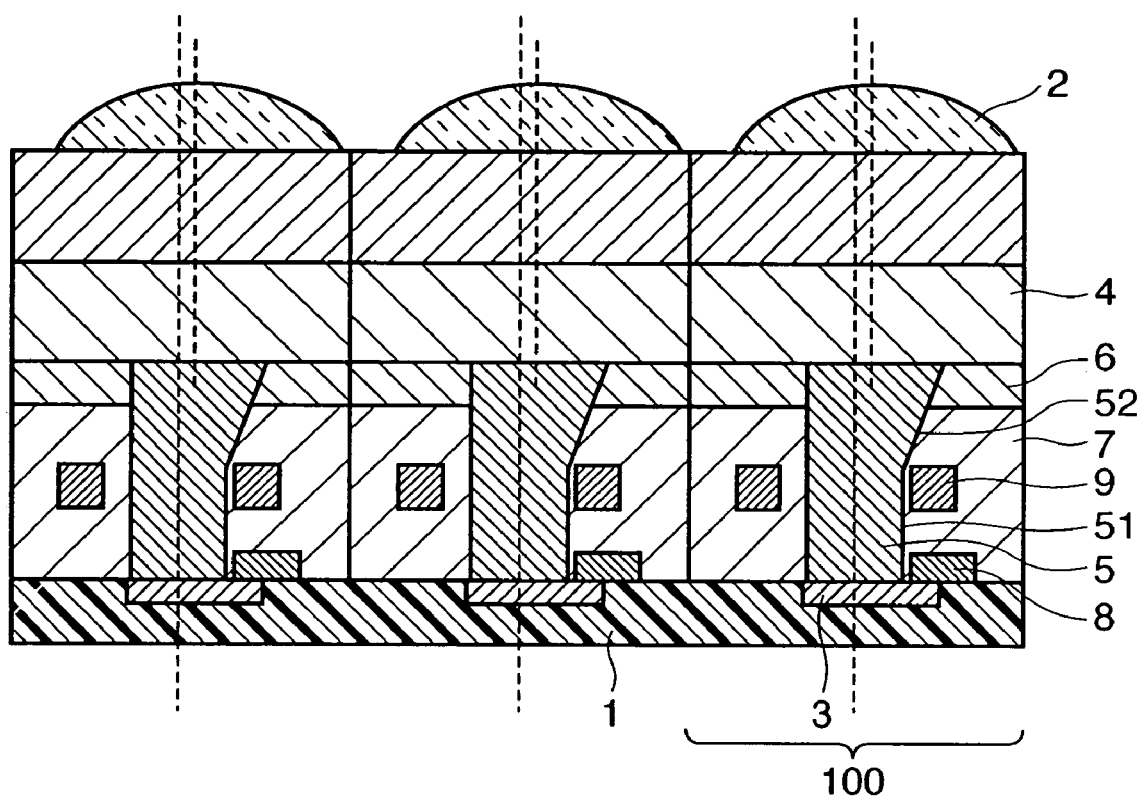
FIG. 1 is a diagram showing the structure of an image sensing element according to a first embodiment of the present invention.

FIG. 1 is a cross-sectional view of an image sensing element, in which reference numeral 1 designates a silicon wafer, 2 designates a microlens, 3 designates a photoelectric converter having the ability to convert received photons into an electric charge, 4 designates a color filter that is a wavelength selector that separates light rays by wavelength; 5 designates a high refractive index part, 6 designates a passivation film provided to protect the photoelectric converter, 7 designates a low refractive index part, 8 designates a Poly wiring layer that acts as a gate that controls the charge on the photoelectric converter, and 9 designates a wiring layer composed of a metal such as aluminum or the like.

In FIG. 1, the microlens 2 is shaped into an upwardly convex spherical surface and has a positive lens power, and therefore acts to concentrate light rays reaching the top of the microlens 2 onto the photoelectric converter 3. Accordingly, because a wider range of light rays can be gathered into the photoelectric converter 3, it is possible to increase the sensitivity of the image sensing element. The high refractive index part 5 is formed of a high refractive index material such as titanium oxide ($TiO_2$), having a refractive index of 2.5, or silicon nitride (SiN), having a refractive index of 2.0. The low refractive index 7 is formed using a low refractive index material such as silicon oxide ($SiO_2$), having a refractive index of 1.46. Oxygen-doped silicon nitride (SiON) having a refractive index of approximately 1.6 is usually used for the passivation film 6. Accordingly, of those light rays striking the high refractive index part 5, those that exceed the critical angle are totally reflected at the interface between the passivation film 6 and the low refractive index part 7, thus performing the function of a light wave path from the color filter 4 to the photoelectric converter 3.

Figure 2:
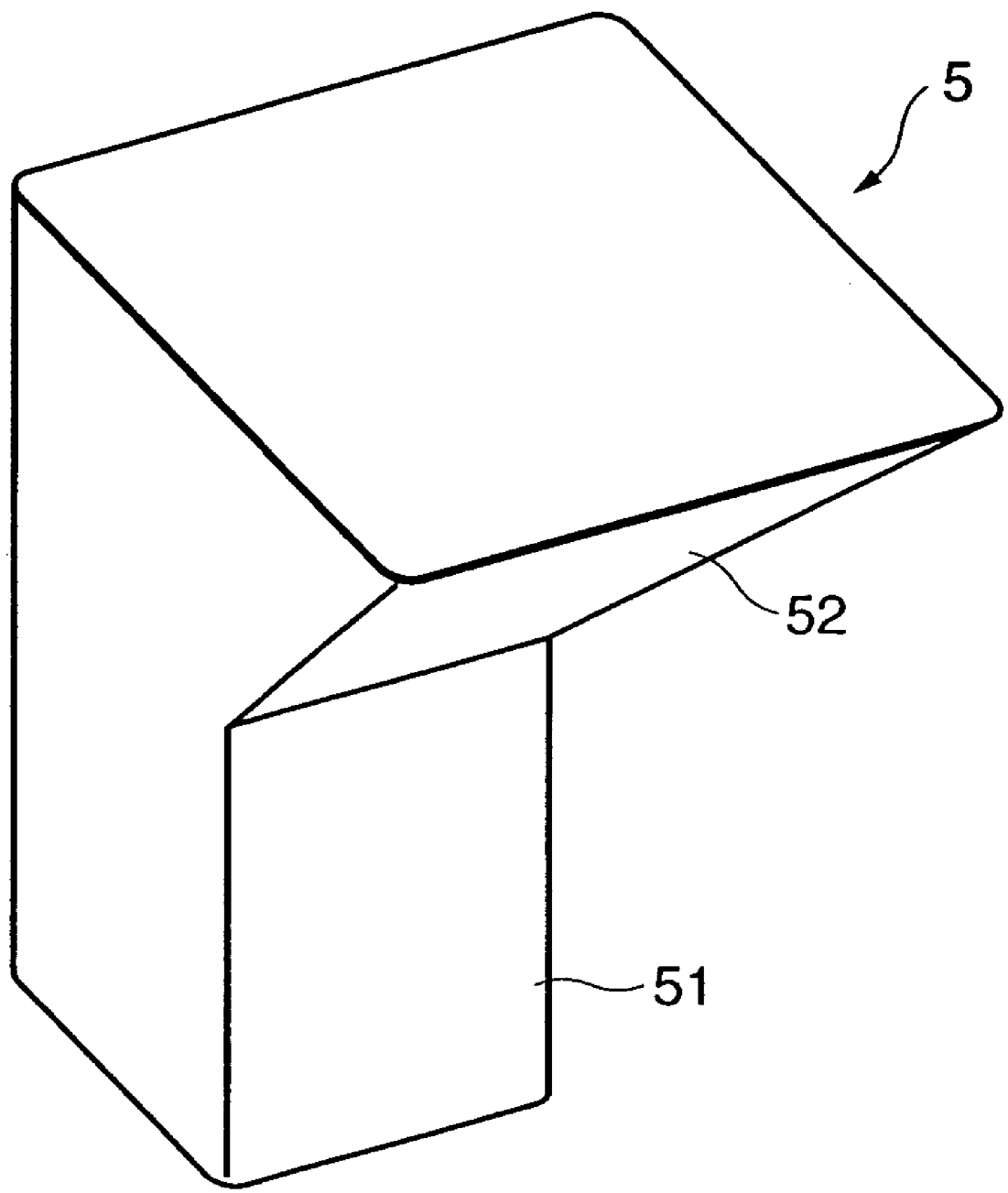
FIG. 2 is a diagram showing a perspective view of a high refractive index portion according to the first embodiment of the present invention.

FIG. 2 shows only the high refractive index part 5 in order to facilitate the description of the shape. The high refractive index part 5 is composed of a rectangular prism 51 having a surface that is substantially parallel to the optical axis at a portion near the photoelectric converter 3 and a tapered part 52 present at the side at which the light rays strike, with a slanted surface having an angle different from that of the rectangular prism 51. Viewed from the top surface (from the microlens side) the prism 51 forms substantially a perfect square, with four surfaces parallel to the optical axis. Similarly, the tapered portion forms substantially a perfect square when viewed from above, although its size differs depending on the height at which it is cut. In the example shown in FIG. 1, the optical axis of the image sensing lens is at the right side of the high refractive index part 5. The tapered part 52 is provided with a taper only at a surface proximal to the optical axis of the image sensing lens, with the surfaces on the distal side having the same angle as the prism 51

(parallel to the optical axis). In other words, although the two surfaces nearest the optical axis of the image sensing lens is tapered, the two surfaces farthest from the prism 51 are parallel to the optical axis continuing from the prism 51.

Figure 3:
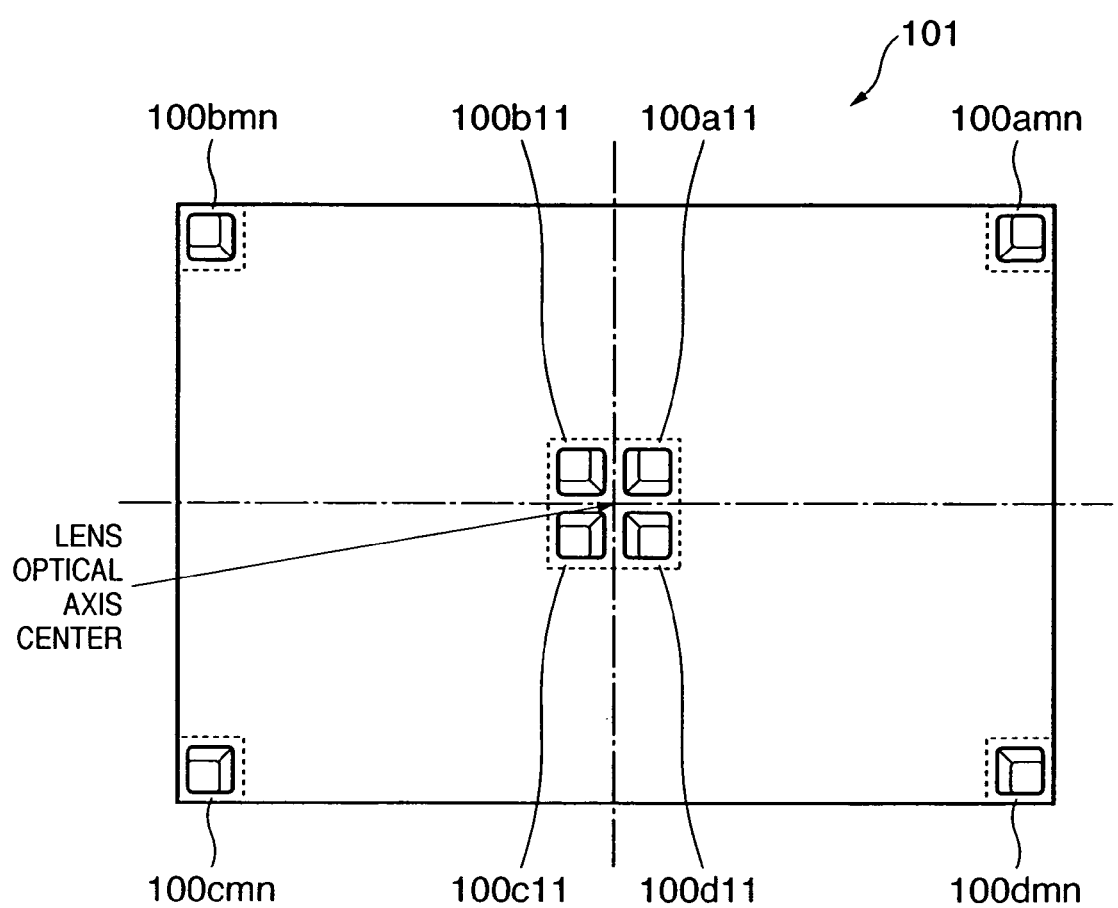
FIG. 3 is a diagram showing a view of an image sensing area according to the first embodiment of the present invention.

FIG. 3 is a diagram for explaining how the high refractive index part 5 is tapered when an image sensing area 101 is vied from the top surface (from the microlens side) according to the first embodiment of the present invention. For simplicity, FIG. 3 only shows the four pixels nearest the optical axis of the image sensing lens and the four pixels at the corners. Since only the surface nearest the optical axis of the image sensing lens is tapered, the direction of the taper is different at each of four quadrants whose origin is the center of the image sensing element (that is, the center of the optical axis of the image sensing lens). Specifically, the taper is formed in a lower left direction for a pixel 100*amn* of a first quadrant, the lower right direction for a pixel 100*bmn* of a second quadrant, the upper right for a pixel 100*cmn* of a third quadrant and the upper left for a pixel 100*dmn* of a fourth quadrant, although the angle of the taper is the same for all quadrants.

As a method of forming the high refractive index part 5, the low refractive index part 7 and the passivation film 6 are made flat, a resist is coated on top, etched, and an aperture through to the vicinity of the photoelectric converter 3 is opened. Thereafter, the high refractive index part 5 material (SiN) is vapor coated thereon. In addition, at the tapered part, by controlling the etching conditions when the aperture is formed a desired shape can be obtained. If the etching conditions change, then the taper angle also changes and the desired shape is not achieved, and therefore, if the structure is one that has the same taper angle throughout as described herein, it can be created easily because the etching conditions do not need to be revised.

Figure 4:
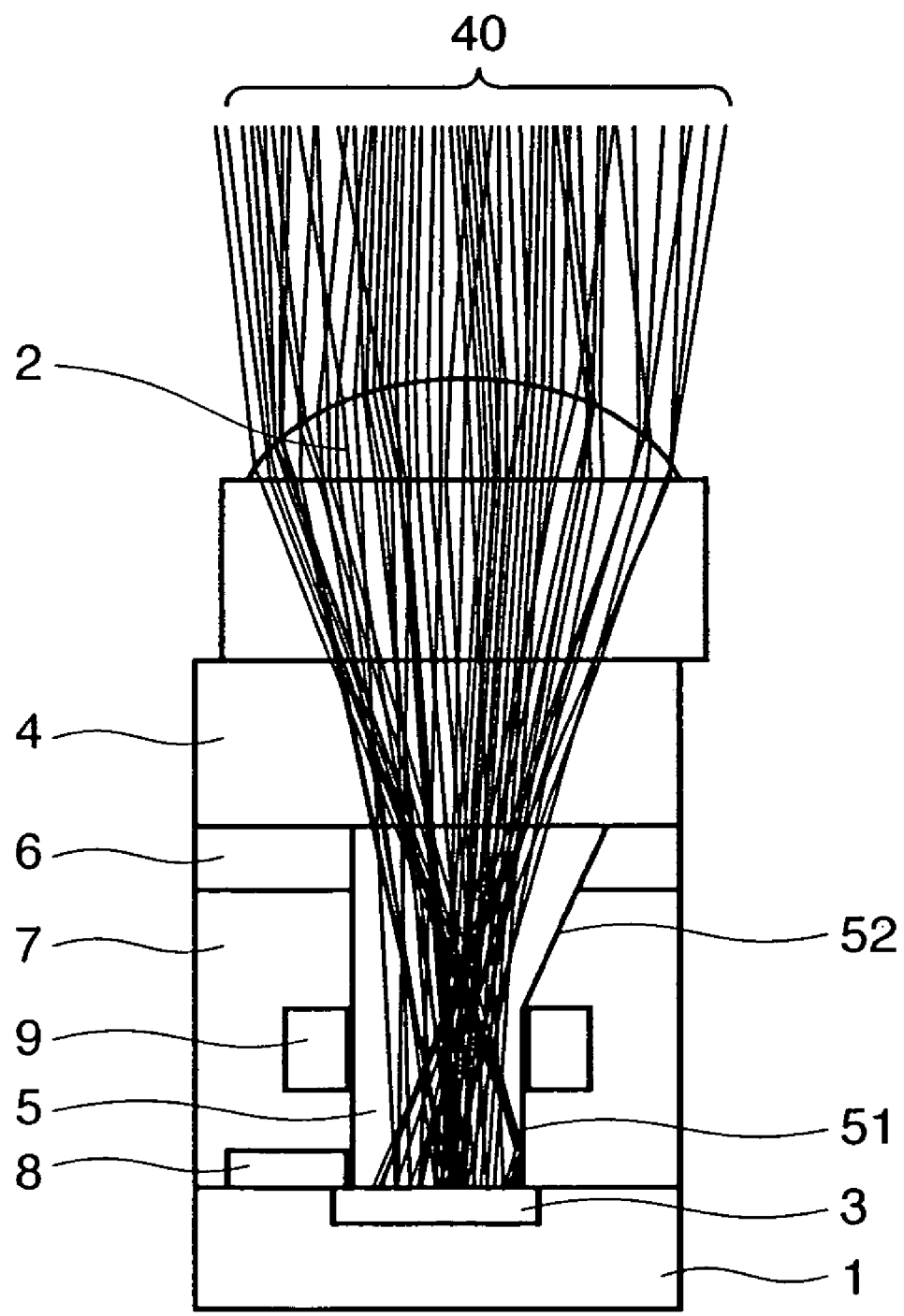
FIG. 4 is a light ray trace diagram for a pixel near to the optical axis of an image sensing lens.

Next, a description is given of the action of the light rays in an image sensing element having the structure described above, using FIGS. 4–6. FIG. 4 shows light rays 40 striking a pixel located near the optical axis of the image sensing lens. As can be understood from FIG. 4, despite being near the center the microlens 2 is nevertheless offset from the central axis of the photoelectric converter toward the optical axis of the image sensing lens. Usually, the central axis of a microlens of a pixel near the optical axis of the image sensing lens is disposed so as to be substantially the same as the central axis of the photoelectric converter. The image sensing element 1 of the first embodiment of the present invention employs a structure in which of the high refractive index part 5, upper part of the sides nearest to the optical axis of the image sensing lens are provided with a taper, and that structure is the same at a pixel in the vicinity of the optical axis of the image sensing lens as well. Hence, because the center of the opening on the side at which the light rays strike the high refractive index part 5 is offset from the central axis of the photoelectric converter 3 toward the optical axis of the image sensing lens, by shifting the microlens 2 the light rays 40 can be made to strike and enter without being cut off by the opening even if the high refractive index part 5 is not symmetrically shaped, and thus there is no loss of efficiency. Moreover, by providing the microlens 2 as with the image sensing element of the first embodiment the incident light rays 40 can be focused, and therefore the opening on the side of the high refractive index part 5 that the light rays strike can be made smaller than the pixel opening and adequate numbers of light rays can still be gathered in. Where the microlens 2 is not provided, it is preferable to make the opening of the high refractive index part 5 that the light rays strike substantially the same as the pixel opening.

Figure 5:
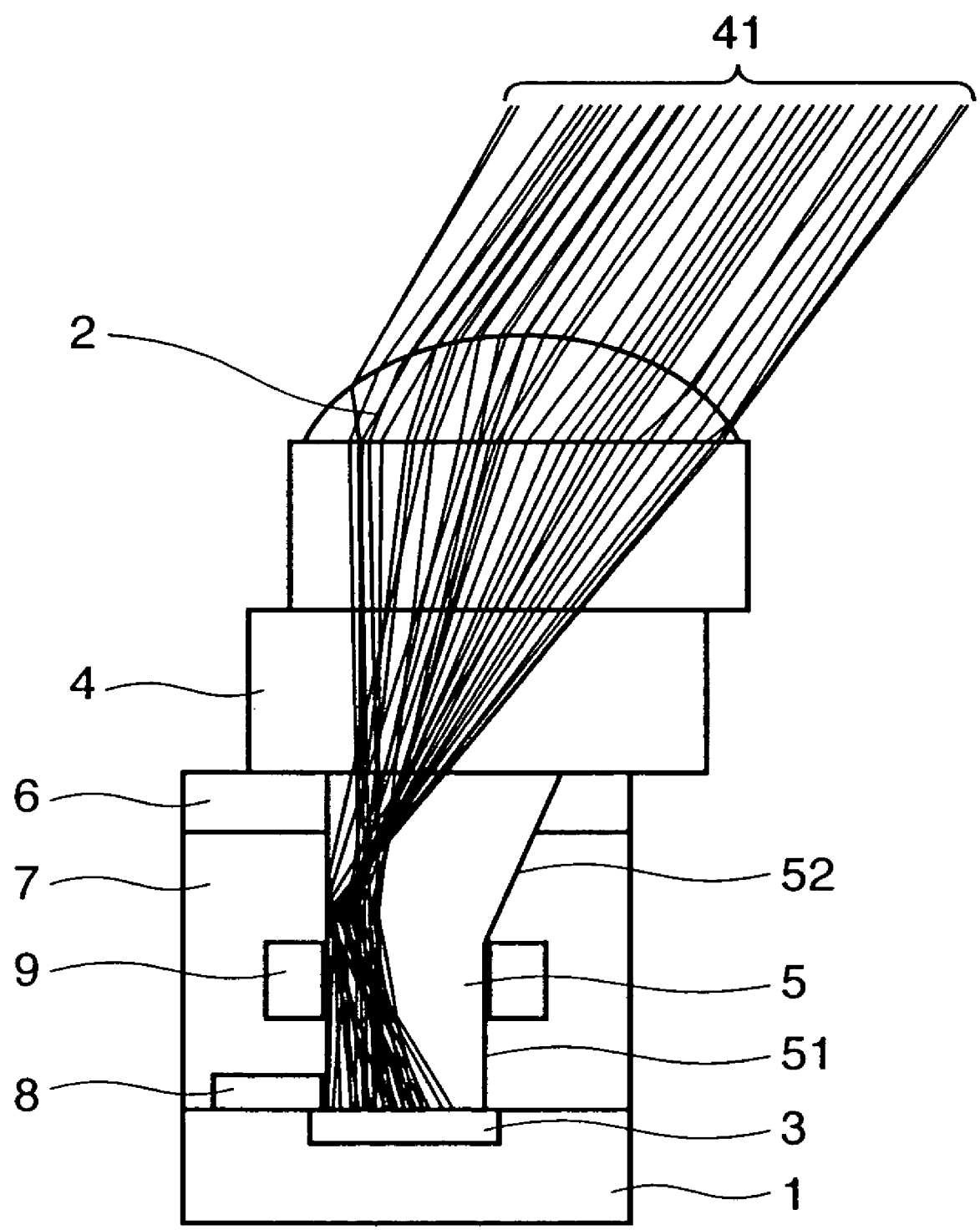
FIG. 5 is a light ray trace diagram for a pixel far from the optical axis of the image sensing lens when the pupil position is near.
Figure 6:
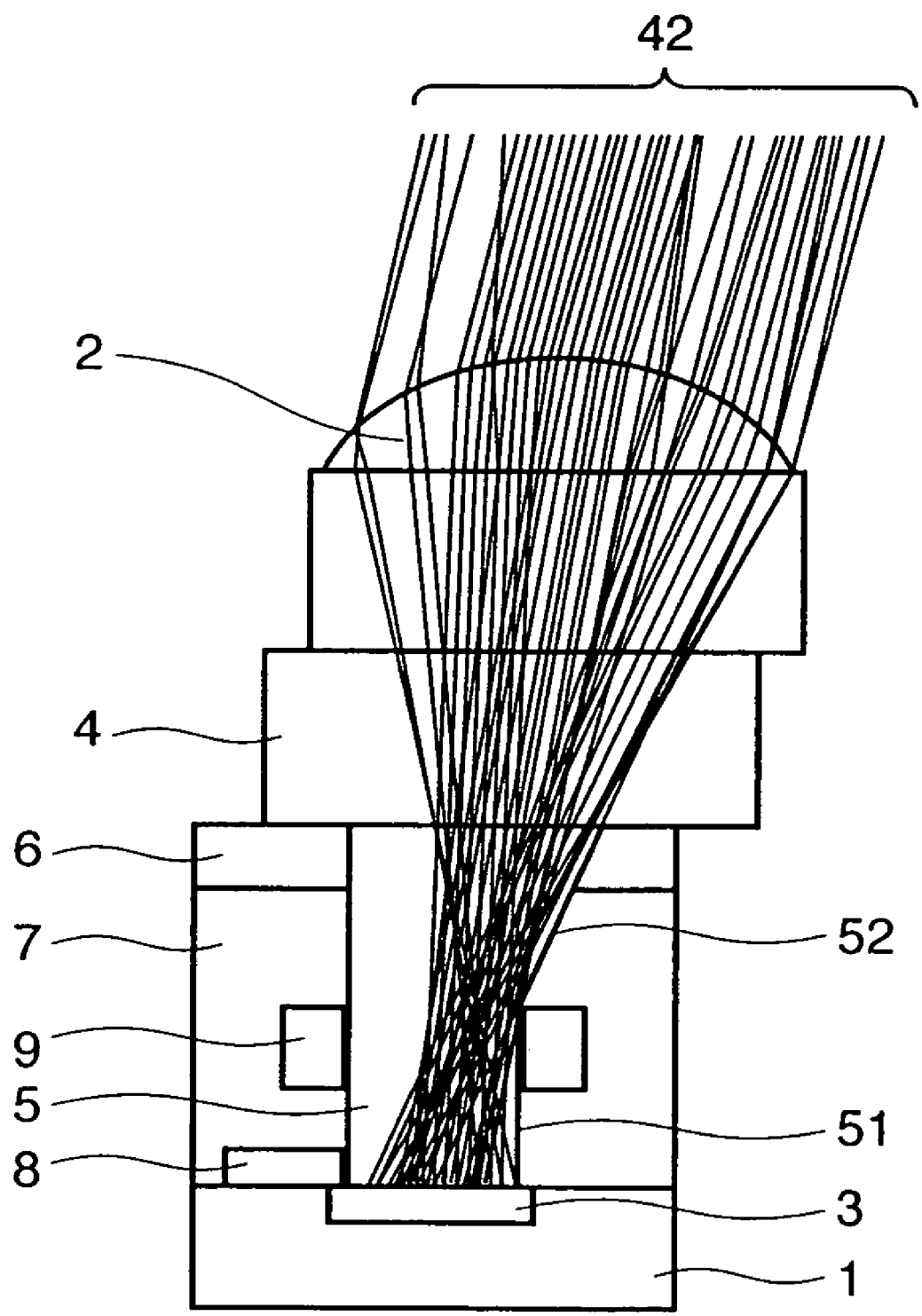
FIG. 6 is a light ray trace diagram for a pixel far from the optical axis of the image sensing lens when the pupil position is far.
Figure 17A:
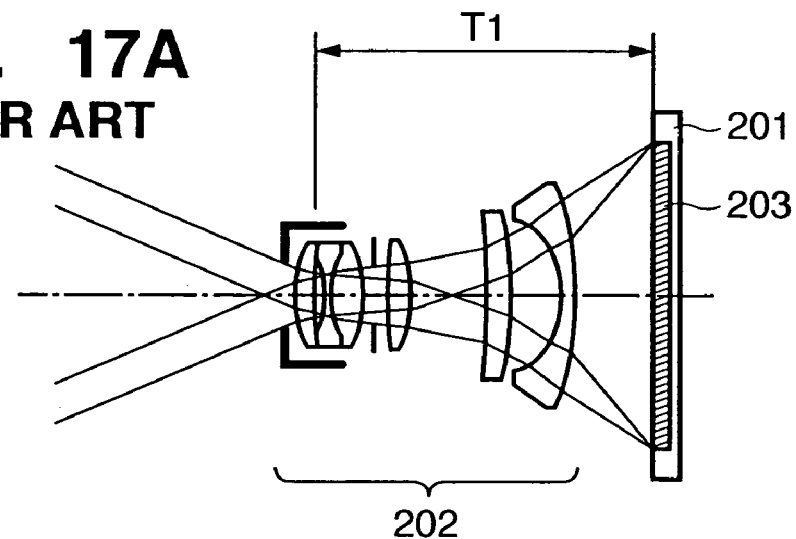
FIGS. 17A and 17B are light trace diagrams for an image sensing element when the focal distance changes.
Figure 17B:
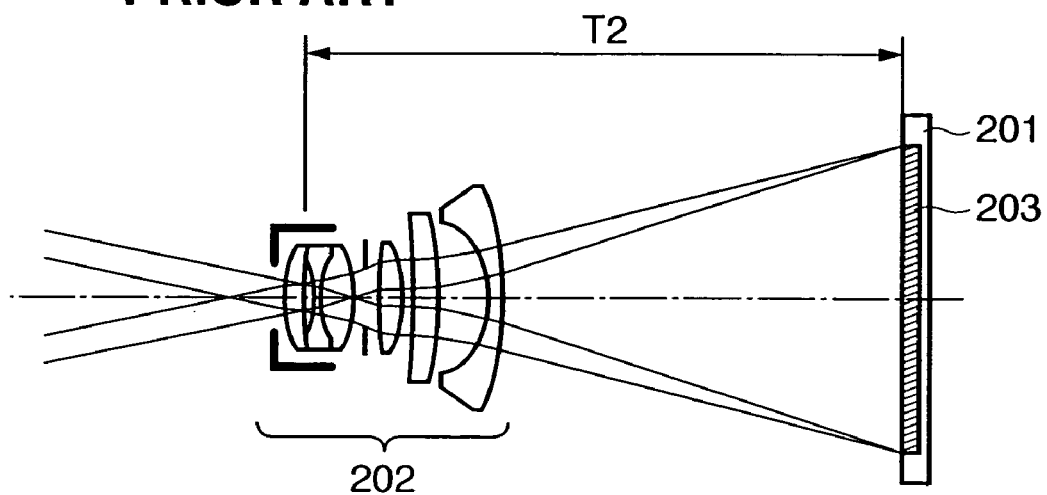
Figure 18:
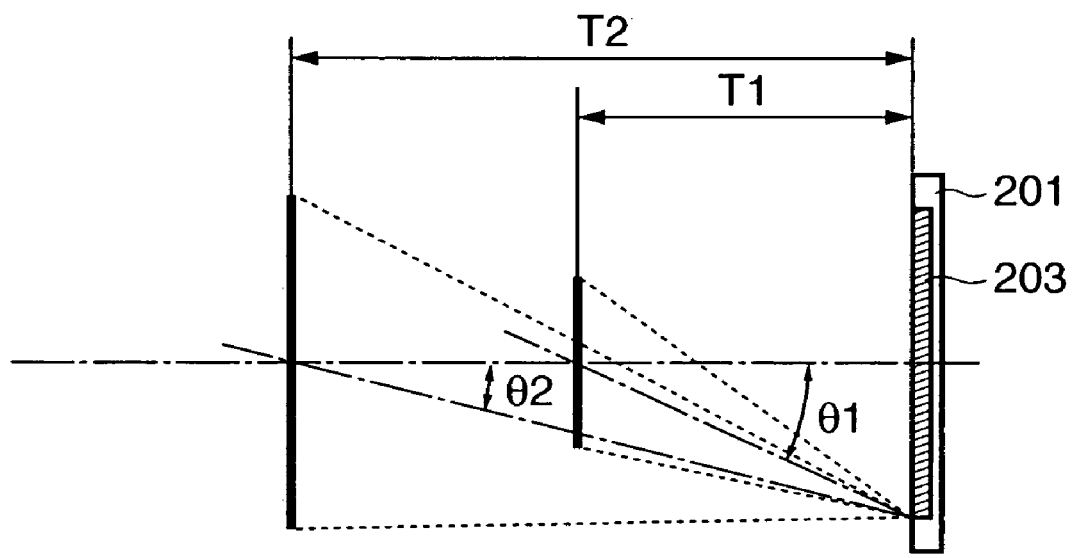
FIG. 18 is a diagram showing schematically the relation between pupil position and image sensing element.
Figure 19:
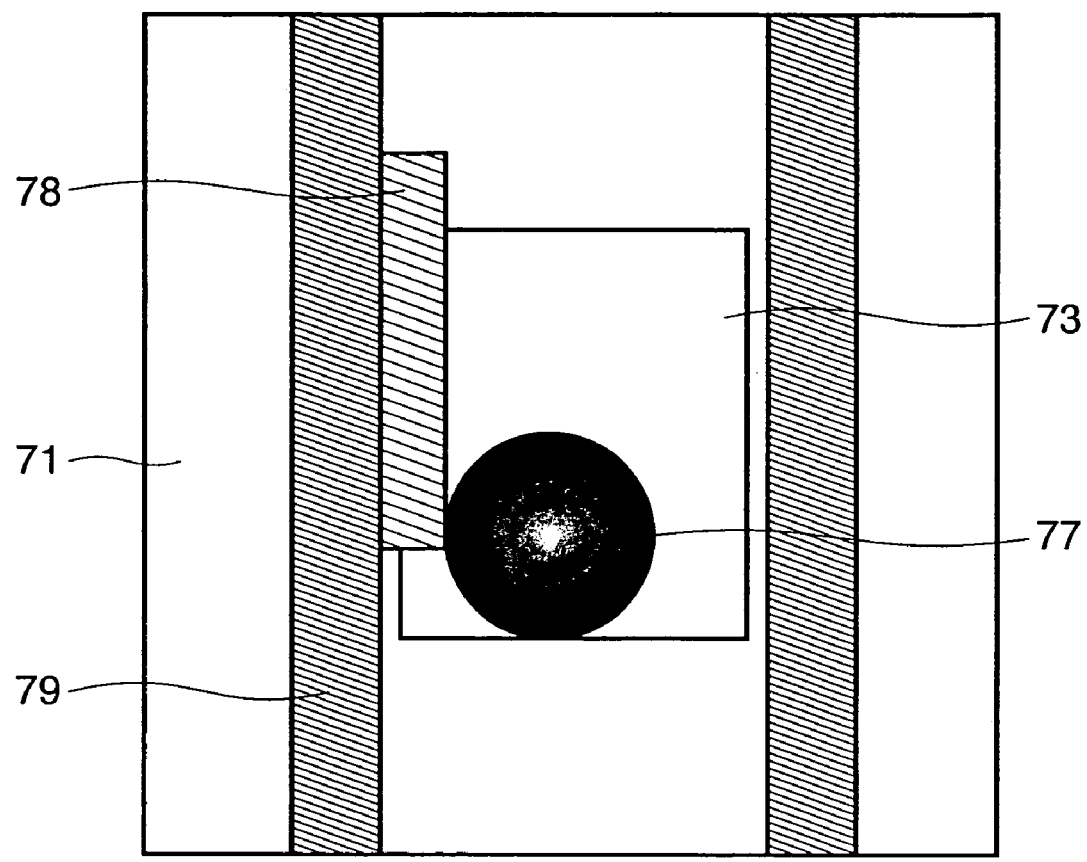
FIG. 19 is a diagram showing an image of a pupil on a photoelectric converter when the pupil is proximal.
Figure 20:
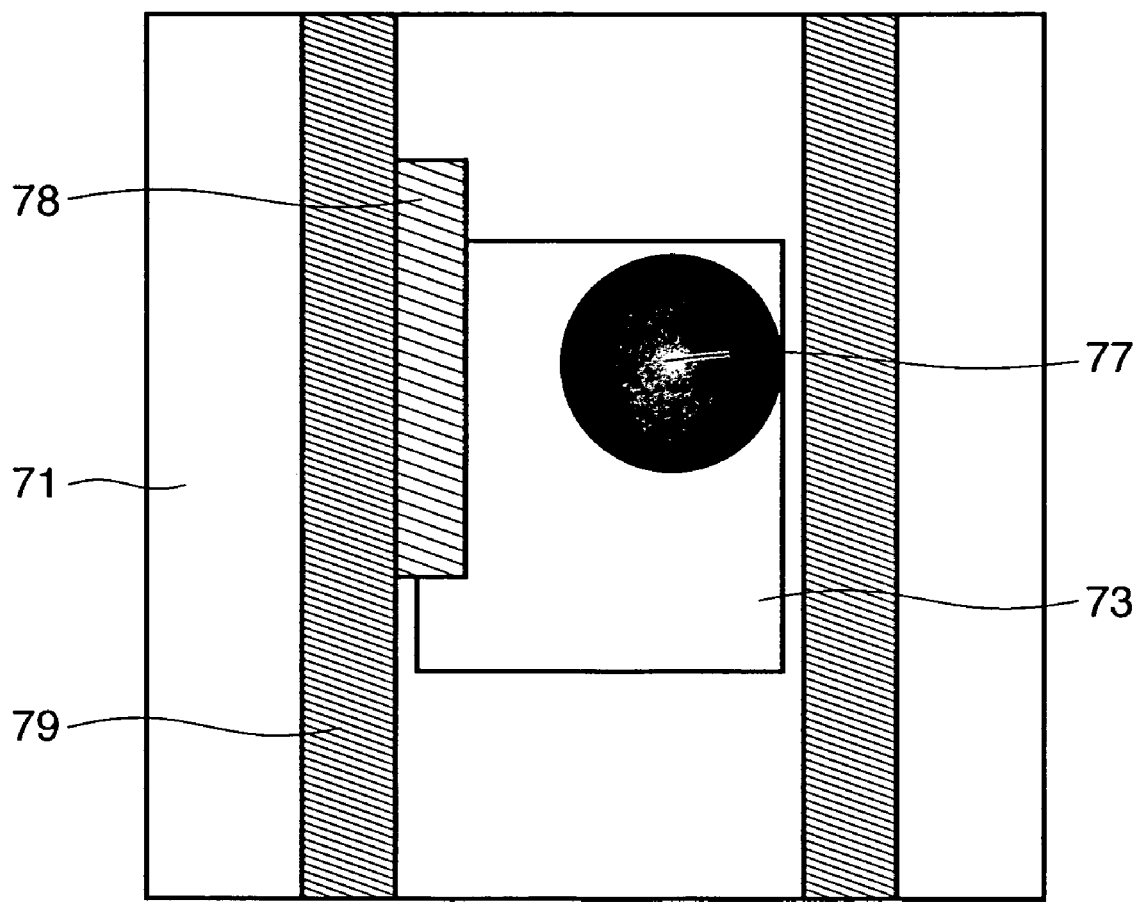
FIG. 20 is a diagram showing an image of a pupil on a photoelectric converter when the pupil is distal.

FIGS. 5 and 6 show light rays striking a pixel located at a position removed from the optical axis of the image sensing lens, with FIG. 5 showing the pupil distance as a short distance on the wide-angle side, where the focal length of the image sensing lens is short (for example, where T1 shown in FIG. 17A is 8 mm), and FIG. 6 showing the pupil distance as a long distance on the telephoto side, where the focal length of the image sensing lens is long (for example, where T2 shown in FIG. 17B is 20 mm). The extent of the offset of the microlens 2 is great because the distance from the optical axis of the image sensing lens is great, and moreover the color filter 4 is also slightly offset, so that the light rays can be gathered in smoothly. Where the focal length of the image sensing lens is short and the pupil distance is short, incident light rays 41 are totally reflected at the surface, of the high refractive index part 5, far from the optical axis (that is, the surface parallel to the optical axis of the image sensing lens) of the image sensing lens and directed to the photoelectric converter 3, and it can be understood that the rays are reflected at a surface at a fairly high location.

Light rays 42 when the focal length of the image sensing lens is increased and the pupil distance is long are shown in FIG. 6. Unlike a case in which the pupil distance is a short distance, where the pupil distance is a long distance the total reflection at the interface is not used so much. With regard thereto, this situation resembles that of a pixel near the optical axis of the image sensing lens, but the position at which the light rays strike the high refractive index part 5 is different. At this time what becomes crucial is the portion of the side at which the light rays strike the high refractive index part 5. As described above, the incoming light rays 42 are offset toward the optical axis of the image sensing lens, but because the taper 52 is provided on the image sensing lens optical axis side of the high refractive index portion 5 the light rays exiting the color filter 4 directly strike the high refractive index part 5. If there were no taper 52, then of the light rays shown in FIG. 6 those light rays 42 entering from the opening portion corresponding to the taper 52 would first strike a passivation film 6 and then head for the high refractive index part 5 either directly or through the low refractive index part 7. In such an instance, the light rays 42 entering the high refractive index part 5 through the low refractive index part 7 and/or the passivation film 6 are not reflected on the surface of the high refractive index part 5 far from the optical axis of the image sensing lens, and consequently some light rays 42 would pass through the surface, unable to strike the photoelectric converter and thus lost.

Therefore, by providing a tapered shape to only the upper parts of the sides of the high refractive index part 5 closer to the optical axis of the image sensing lens, the light rays strike as described above, an image sensing element can be provided that does not lose light-gathering efficiency even when the pupil position of the image sensing lens changes.

Consequently, the image sensing element of the first embodiment of the present invention, because it enables light over a wide range of entry angles to be gathered into the image sensing element, is suitable for an optical instrument equipped with an image sensing lens in which the focal distance is short and the pupil distance is short or an image sensing lens in which the zoom ratio is large and the focal distance is variable. For example, with an image sensing lens with a minimum pupil distance of $T1 \leq 10$ mm, or a lens configuration in which the ratio T2/T1 (where T2 is the pupil distance when the focal length of the image sensing lens is long and T1 is the pupil distance when the focal distance is short) is 2 or greater, it is possible to provide an optical instrument with high light-gathering efficiency. Accordingly, it becomes possible to provide a super-compact optical instrument.

Second Embodiment

Figure 7:
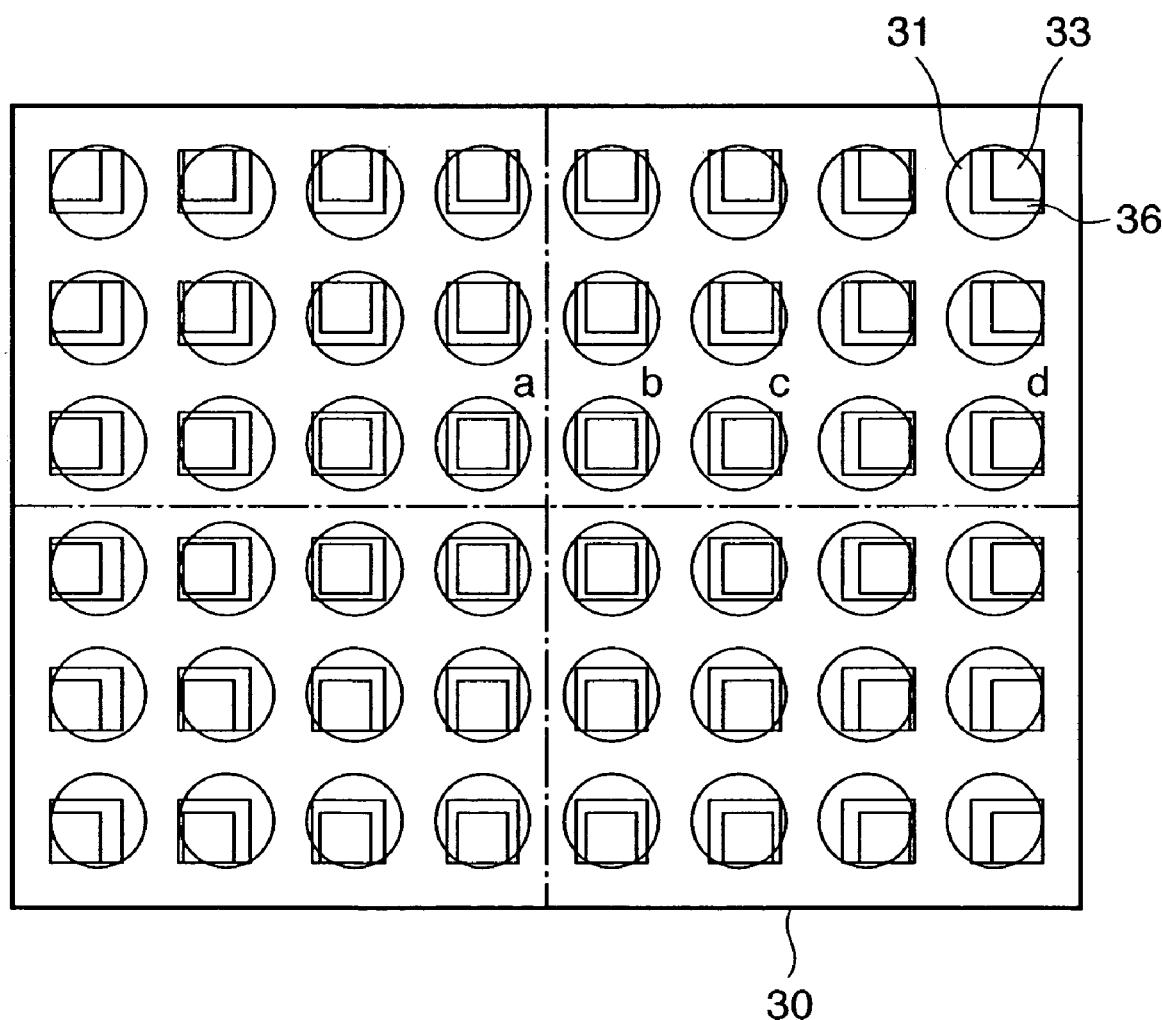
FIG. 7 is a diagram showing a plan view of a solid-state image sensing element according to a second embodiment of the present invention.

FIG. 7 is a plan view of a solid-state image sensing element according to a second embodiment of the present invention.

In FIG. 7, reference numeral 30 designates a solid-state image sensing element, with the individual pixels of the solid-state image sensing element 30 comprising a microlens 31 for concentrating light from an image sensing lens (not shown), a photo-sensing portion 33 that converts the incident light into electrical signals whose strength varies according to the amount of light, and a light wave path 36. It should be noted that, for simplicity of description, in FIG. 7 only 8×6 pixels are shown, whereas in reality several hundreds of thousand or several million pixels are arrayed. The photo-sensing portions 33 of the pixels are equidistantly spaced, although in relation to the photo-sensing portions 33 the microlenses 31 are offset toward the center of the solid-state image sensing element 30 (that is, the optical axis of the image sensing lens, not shown). In addition, the light wave paths 36 are formed into pyramidal prisms and given different shapes depending on the pixel position.

FIG. 8A shows a cross-sectional view of the structure of the pixels positioned at a, b and c in FIG. 7 (hereinafter referred to as pixels, a, b, c), and FIG. 8B shows a cross-sectional view of the structure of a pixel positioned at a point d (hereinafter pixel d). It should be noted that the a-d attached to the ends of the reference numerals indicating the structures of the pixels are for the purpose of identifying the corresponding pixels a–d. As can be understood from FIG. 7, pixels a, b are positioned substantially at the center of the solid-state image sensing element 30, pixel c is adjacent to pixel b, and pixel d is positioned at the edge of the solid-state image sensing element 30.

In FIGS. 8A and 8B, reference numeral 32 designates a Si substrate, on which are formed photo-sensing portions 33a–33d. Reference numeral 38 designates wiring electrodes, formed between inter-layer insulation portion 35 made of SiO$_2$ or the like having low refractive index. In addition, reference numeral 34 designates transfer electrodes for transferring the photoelectric charges generated at the photo-sensing portions 33a–33d to a floating diffusion (FD) part, not shown. Reference numerals 36a–36d designate light wave paths composed of a high refractive index material such as SiN, the central axes of which are substantially the same as the central axes of the photo-sensing portions 33a–33d. The sides of the light wave paths 36a–36d that the light rays enter are formed into wide-mouthed openings in order to be able to take in more light. Reference numerals 37a–37d designate color filters, with microlenses 31a–31d further formed thereon atop an interceding flattened layer. The shape of the lenses of the microlenses 31a–31d is designed to concentrate light rays entering from an image sensing lens (not shown) onto the photo-sensing portions 33a–33d.

The pixels a, b positioned at the center of the solid-state image sensing element 30 are configured so that, because the main light rays entering from the image sensing lens (not shown) strike the pixels substantially vertically, optical axes 44a, 44b of the microlenses 31a, 31b, respectively, and central axes 43a, 43b of the light wave paths 36a, 36b, respectively, essentially coincide. The light wave paths 36a, 36b form regular square pyramidal prism that are symmetrical about the central axes 43a, 43b thereof.

By contrast, at pixels c and d, which are not positioned at the center of the solid-state image sensing element 30, the main light rays of the light entering from the image sensing lens, not shown, strike at a predetermined angle determined by the position of the pixel and the exit pupil of the image sensing lens. Accordingly, the optical axes 44c and 44d of the microlenses 31c and 31d, respectively, are offset toward the center of the image sensing element 30 with respect to the central axes 43c and 43d of the light wave paths 36c and 36d, respectively. In addition, the light wave paths 36c and 36d are formed into quadrilateral pyramidal prism asymmetrical with respect to the central axes 43c and 43d. In other words, the angle of the slanted surface on the central portion side of the solid-state image sensing element 30 is constant with respect to the central axes 43c and 43d of the light wave paths 36c and 36d, respectively, but the angle of the slanted surface on the peripheral portion-side of the solid-state image sensing element with respect to the central axes 43c and 43d differs depending on the position of the pixel. That is, the angle of incidence of the main light rays entering from the image sensing lens deepens toward the periphery of the solid-state image sensing element, and therefore the angle of the slanted surface positioned at the peripheral portion side is shaped so as to approach perpendicular with respect to the Si substrate 32, thus flattening out the angle of incidence at which the light rays strike the slanted surface of the light wave path 36.

It should be noted that, although bringing the slanted surface of the peripheral portion side of the light wave paths 36c and 36d near the perpendicular as described above reduces the surface area of the openings of the light wave paths 36c and 36d, by offsetting the positions of the microlenses 31c and 31d toward the center of the solid-state image sensing element 30 as described above, it is possible to direct the light concentrated by the microlenses 31c and 31d into the light wave paths 36c and 36d, respectively, in the same amount as the light concentrated by the microlenses 31a and 31b is directed into the light wave paths 36a and 36b. Thus, as described above, the installation positions of the microlenses of the pixels are revised as appropriate based on such conditions as the distance from the exit pupil of the image sensing lens, the light-gathering power of the microlenses and the distance to the openings of the light wave paths.

Figure 9:
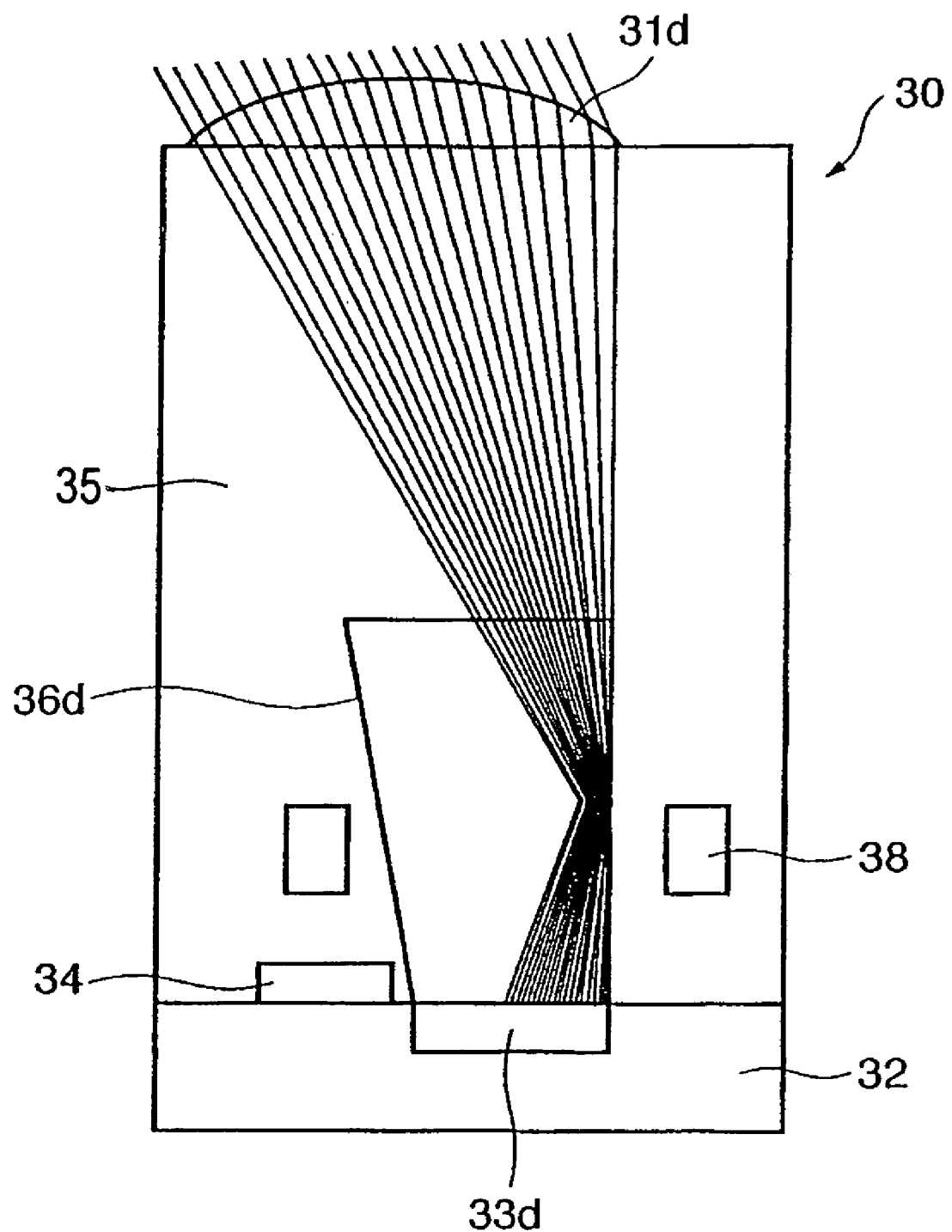
FIG. 9 is a light ray trace diagram for a peripheral pixel according to the second embodiment of the present invention.

FIG. 9 is a diagram showing a situation in which light rays striking the pixel d at the edge of the solid-state image sensing element 30 when the distance between the exit pupil and the solid-state image sensing element 30 has been shortened by further making an image sensing lens, not shown, more compact. The light rays striking the solid-state image sensing element 30 at a deep angle is refracted by the microlens 31d and enters the light wave path 36d made of high refractive index material. Here, the slanted surface of the peripheral portion side of the light wave path 36 is formed so as to be essentially vertical with respect to the Si substrate 32, and therefore the angle of the light rays striking the slanted surface is made shallow, fulfilling total reflection conditions. As a result, even light rays striking the solid-state image sensing element 30 at a deep angle are totally reflected at the slanted surface of the light wave path 36 and efficiently directed to the photo-sensing portion 33d.

Figure 10:
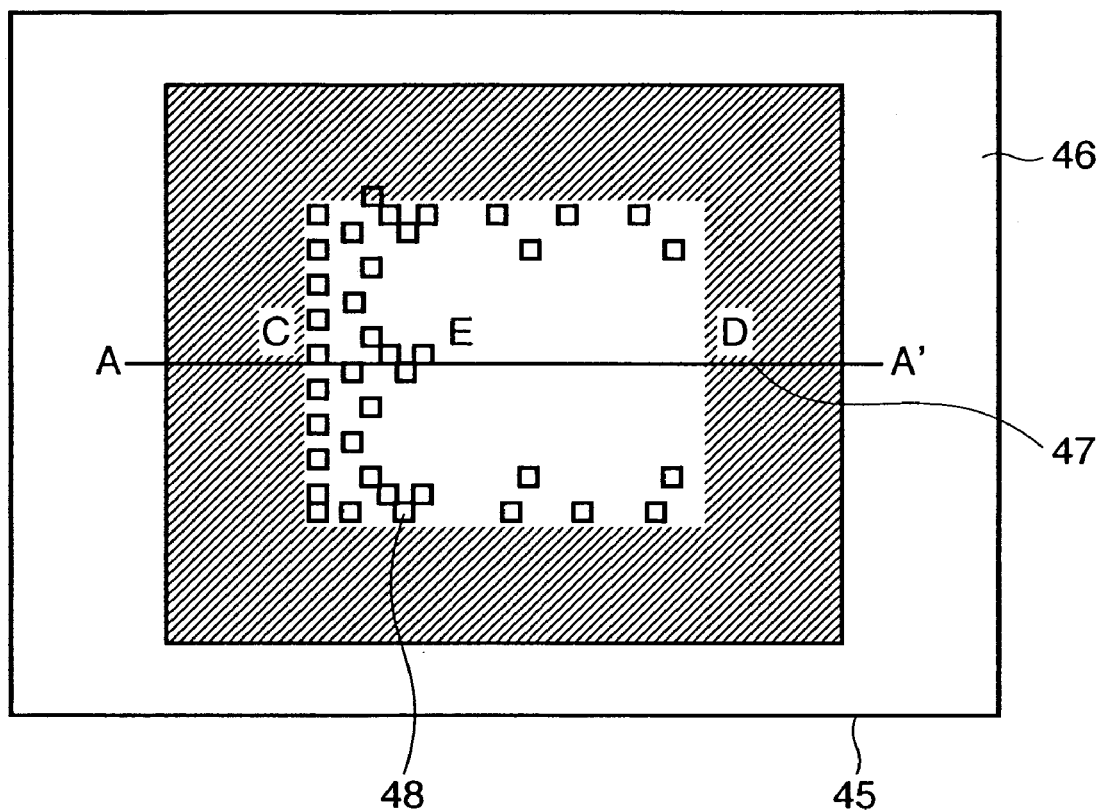
FIG. 10 is a diagram showing an example of a photomask used to form a light wave path according to the second embodiment of the present invention.

A description is now given of a process for forming an asymmetrical light wave path 36 whose asymmetry changes according to the position of an pixel on the solid-state image sensing element 30, using the photomask illustrative diagram in FIG. 10 and the light wave path formation process illustrative diagrams in FIGS. 11A–11D.

FIG. 10 shows one example of a photomask used for forming a light wave path of a single pixel of the solid-state image sensing element 30 of the present invention. In the second embodiment of the present invention, a selectively rendered dot pattern, that is, a photomask film pattern 47 composed of a desired dot pattern created by gradually changing the density of dots 48, is formed on a photo-permeable supporting body 46 of a quartz substrate or the like so as to construct a photomask 45. The dots 48 are of uniform shape, and in the present example are formed into identical squares. In this second embodiment, when viewed along a line A–A' it can be seen that the interval A-C and the interval D-A' (the mesh portion of FIG. 10) have the highest dot density, and conversely no dots exist in the interval D-E. Moreover, the interval C-E is configured so that the dots 48 are dispersed and the dot density gradually decreases. In FIG. 10 the dot density distribution is like that just described, but the dot density distribution of the photomask pattern is designed to vary according to the position on the solid-state image sensing element 30 of the pixel corresponding to the light wave path to be formed.

Next, a description is given of a light wave path formation method using a lithographic process for patterning the resist film using the photomask 45, using the process illustrative diagrams of FIGS. 11A–11D.

Figure 11A:
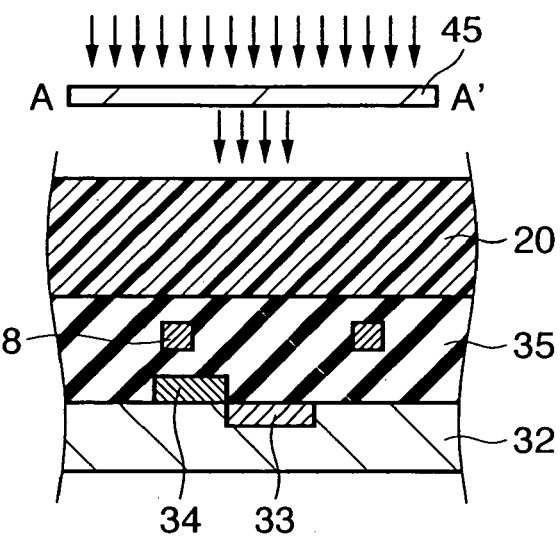
FIGS. 11A, 11B, 11C and 11D are schematic diagrams illustrating a process for forming a light wave path according to the second embodiment of the present invention.

As shown in FIG. 11A, an interlayer insulation portion 35 containing wiring electrodes 38 is formed atop the Si substrate 32 in which the photo-sensing portions 33 are formed. On top of this interlayer insulation portion 35 is formed a positive type resist film (i.e., a positive photosensitive resin film) 20. Then, the photomask 45 having a predetermined dot density distribution is provided at areas corresponding to the pixels and the whole arrangement is exposed through the photomask 45. In this case, the exposure density of the photomask 45 along a line A–A' is controlled by changing the density of the dots 48 depending on the position of the pixel as described above.

Figure 11B:
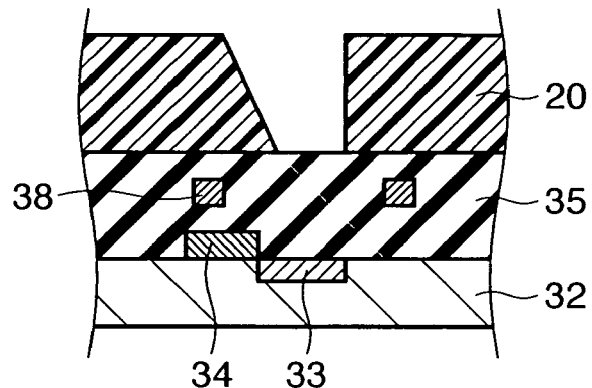

By further carrying out the development process, as shown in FIG. 11B an asymmetrically cut pattern is formed in the resist film 20 corresponding to the exposure density of the photomask 45.

Figure 11C:
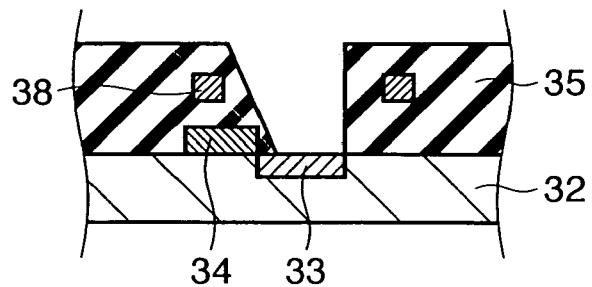

Next comes a reactive ion etching process, by which, as shown in FIG. 11C, the resist 20 pattern is transferred to the interlayer insulation portion 35 and a concave portion that becomes an asymmetrical light wave path is formed directly above the photo-sensing portion 33.

Figure 11D:
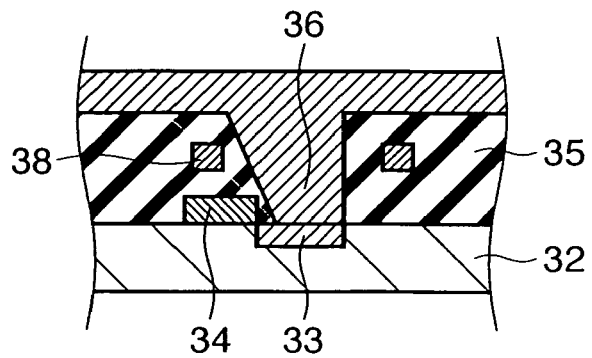
Figure 14A:
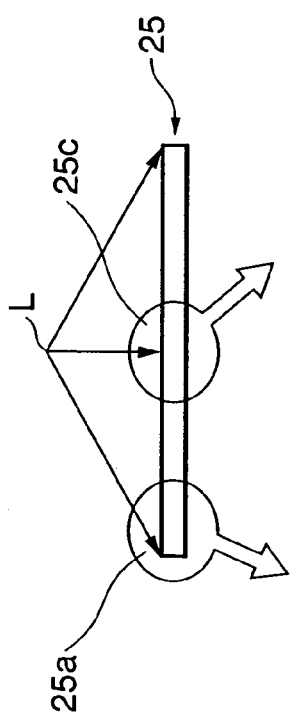
FIGS. 14A, 14B and 14C are diagrams showing the structure of a conventional image sensing element.
Figure 14B:
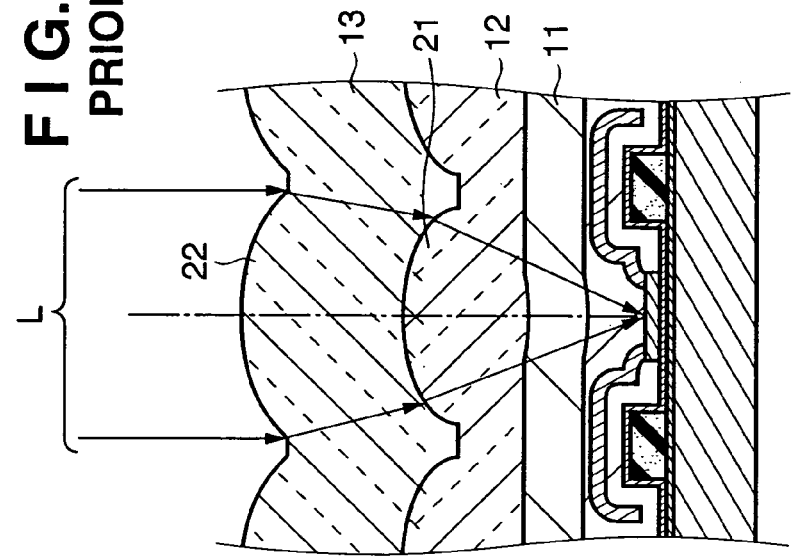
Figure 14C:
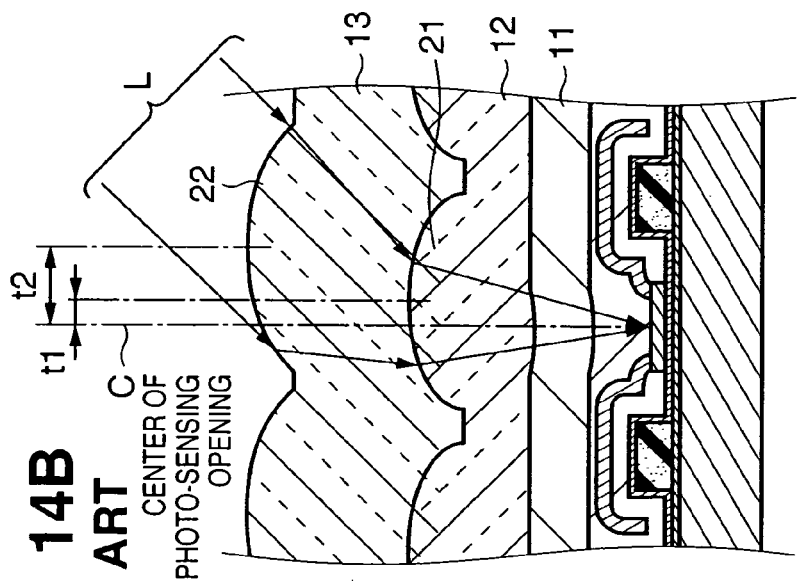
Figure 15:
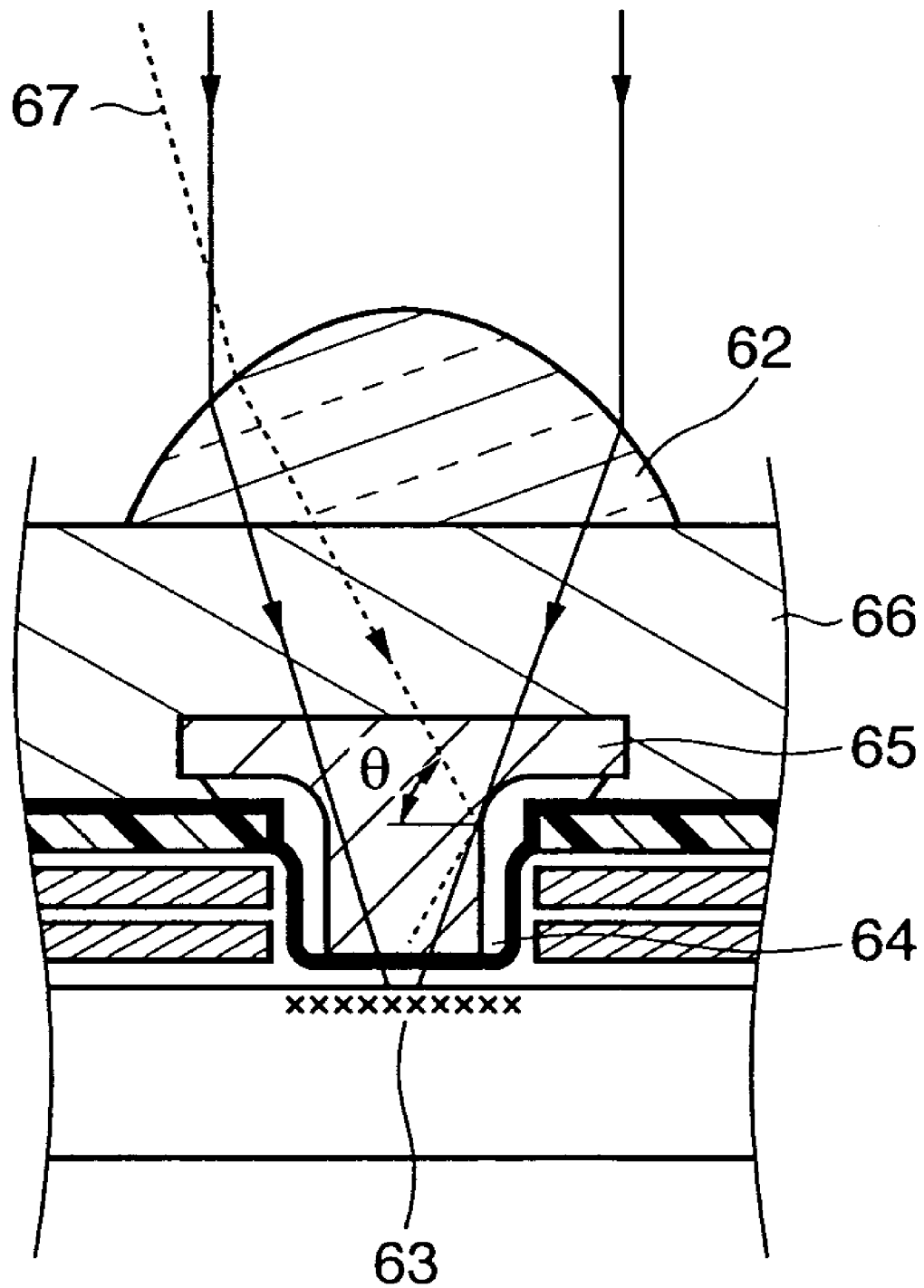
FIG. 15 is a diagram showing the structure of another conventional image sensing element.
Figure 16A:
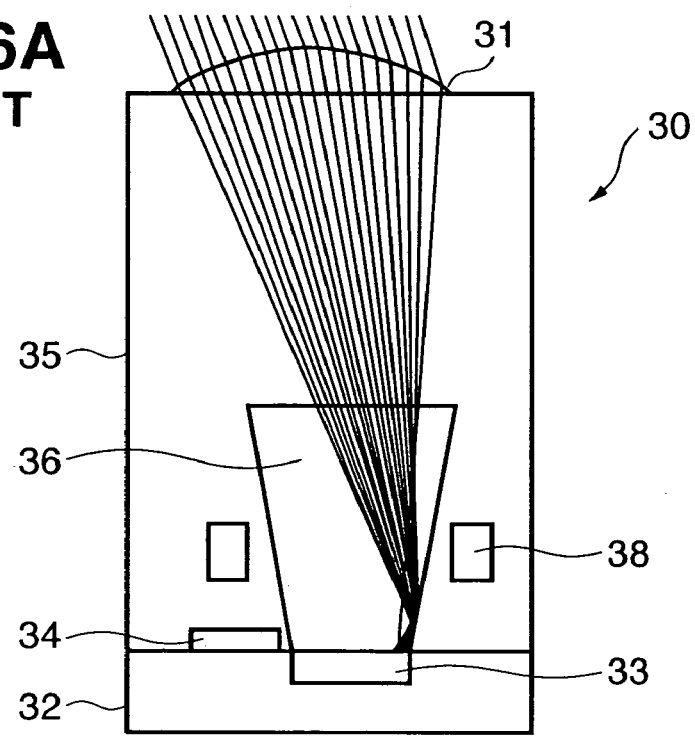
FIGS. 16A and 16B are light trace diagrams of a single pixel of a conventional solid-state image sensing element.
Figure 16B:
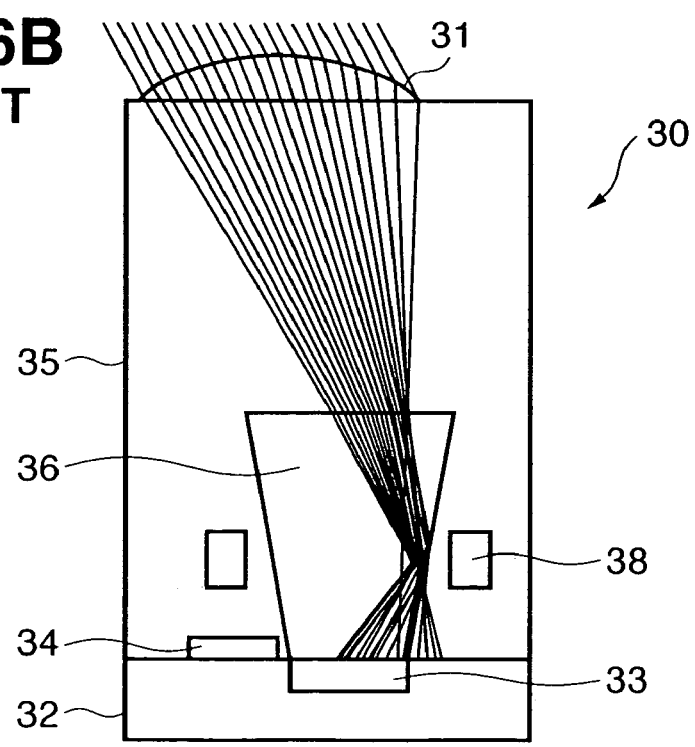

Furthermore, as shown in FIG. 11D, the asymmetrical concave portion formed in the interlayer insulation portion 35 is covered with SiN, which is a high refractive index material, to form the light wave path 36.

As described above, according to the second embodiment of the present invention, by changing the shape of the light wave path depending on the position of the pixel so that light entering the light wave path is fully reflected within the light wave path, light entering the light wave path can be efficiently directed to the photo-sensing portion.

(Variation)

In the above-described second embodiment, the example used is one in which the light wave paths 36 of the pixels of which the solid-state image sensing element 30 is composed are configured so that the angle of the slanted surface positioned on the peripheral side approaches the perpendicular with respect to the center of the solid-state image sensing element as one approaches the periphery of the solid-state image sensing element 30. However, it should be noted that the same effect as described in the second embodiment can also be obtained with a solid-state image sensing element like that shown in the schematic cross-section view shown in FIGS. 12A and 12B.

In other words, by having at least a part of the slanted surface which positions on the periphery side with respect to the center of the solid-state image sensing element includes a surface that is perpendicular to the Si substrate 32 and increasing the ratio of perpendicular surface to slanted surface with a uniform angle of slant toward the peripheral portion of the solid-state image sensing element 30, it is possible to satisfy total reflection conditions even for light rays striking the solid-state image sensing element 30 at a deep angle and to direct the light rays onto the photo-sensing portion 33 efficiently.

Furthermore, in addition to the structure in which the slanted surfaces on the periphery side of the light wave paths approach the perpendicular toward the periphery of the solid-state image sensing element described above in the second embodiment, the slanted surface on the center side may be slanted to increase the opening of the surface. However, the slanted surfaces on the center side also must be of an angle that maintains total reflection conditions.

Moreover, although in the second embodiment described above the shape of the light wave path is a pyramidal prism, the light wave path of the present invention is not limited to such a shape, and thus may be formed into the shape of, for example, a multilateral pyramidal prism and a truncated cone.

Third Embodiment

In the second embodiment of the present invention described above, the example is used of directing light onto a photo-sensing portion using total reflection at the interface between two materials of different refractive index of the light wave path. However, the same effect as that provided by the second embodiment can also be achieved with a structure like that shown in the schematic cross-sectional view of the solid-state image sensing element shown in FIGS. 13A and 13B.

In other words, by providing the light wave path 39 having a lens effect between the wiring electrode 38 and the color filter 37 and reducing the curvature of the peripheral portion of the lens body that is the light wave path 39 toward the periphery of the solid-state image sensing element 30, it is possible to direct incident light efficiently to the photo-sensing portion 33 using the stronger refractive effect thus obtained against light rays striking the solid-state image sensing element 30 at a deep angle.

According to the third embodiment, as with the second embodiment, regardless of the position of the pixel in the solid-state image sensing element, light entering the light wave path can be efficiently directed to the photo-sensing portion.

As many apparently widely different embodiments of the present invention can be made without departing from the spirit and scope thereof, it is to be understood that the invention is not limited to the specific preferred embodiments described above thereof except as defined in the claims.

CLAIM OF PRIORITY

This application claims priority from Japanese Patent Application Nos. 2003-414029 and 2003-414030 filed on Dec. 12, 2003, and No. 2004-066293, filed on Mar. 9, 2004, which are incorporated herein by reference.

What is claimed is:

1. An image sensing element comprising:
a high refractive index part that covers at least a portion of each of a plurality of photoelectric converters arrayed in one dimension or two dimensions; and
a low refractive index part provided at a periphery of said high refractive index part,
wherein an interface between said high refractive index part and said low refractive index part has a surface that is substantially parallel to the optical axis of an image sensing lens and a slanted surface of an angle different from that of the parallel surface,
and the slanted surface is disposed on a portion of a surface near the optical axis of the image sensing lens, the portion being on a side that light rays from the image sensing lens enter the image sensing element.

2. The image sensing element according to claim 1, wherein the angles of the slanted surfaces are essentially identical regardless of a distance from the optical axis of the image sensing lens to each of the plurality of photoelectric converters.

3. The image sensing element according to claim 1, further comprising a plurality of microlenses each corresponding to one of the plurality of photoelectric converters, for concentrating light rays from an external source,
wherein the optical axis of each of the plurality of microlenses offsets from a central axis of the photoelectric converter toward the optical axis of the image sensing lens by an amount that differs depending on a distance of the photoelectric converter from the optical axis of the image sensing lens.

4. An optical instrument equipped with the image sensing element according to claim 1, wherein the optical instrument is provided with an image sensing lens of a pupil distance from the image sensing element of 10 mm or less.

5. The optical instrument according to claim 4, wherein the focal length of the image sensing lens is variable and a ratio of the pupil distance at a maximum focal length to the pupil distance at a minimum focal length is 2 or greater.

6. A solid-state image sensing element composed of a plurality of pixels arranged on a projected image formation surface of an image sensing lens, each pixel comprising:
a microlens;
a photoelectric conversion unit that converts incident light into an electrical signal; and
a light-directing unit composed of a transparent, high refractive index material, disposed between said microlens and said photoelectric conversion unit and directing light from said microlens to said photoelectric conversion unit,
wherein said light-directing unit having a shape that differs depending on the position of each of the plurality of pixels in the solid-state image sensing element, such shape satisfying conditions for total reflection of light entering from said microlens within said light-directing unit.

7. The solid-state image sensing element according to claim 6, wherein:
said microlens is disposed so as to be offset toward the center of the solid-state image sensing element with respect to the optical axis of said photoelectric conversion unit depending on the position of a corresponding pixel in relation to the center of the solid-state image sensing element; and
said light-directing unit has an opening that accommodates 'substantially all the light from said microlens.

8. The solid-state image sensing element according to claim 6, wherein said light-directing unit has a multilateral pyramidal prism shape or a truncated cone shape, a top surface of which is larger than a bottom surface.

9. The solid-state image sensing element according to claim 8, wherein said light-directing unit is formed so that an angle of a slanted surface positioned on a peripheral side of the solid-state image sensing element approaches the perpendicular the farther the pixel is positioned from the center of the solid-state image sensing element.

10. A solid-state image sensing element composed of a plurality of pixels arranged on a projected image formation surface of an image sensing lens, each pixel comprising:
a microlens;
a photoelectric conversion unit that converts incident light into an electrical signal; and
a light-directing unit composed of a transparent, high refractive index material, disposed between said microlens and said photoelectric conversion unit and directing light from said microlens to said photoelectric conversion unit,
wherein said light-directing unit having a shape such that a curvature on a periphery side of the solid-state image sensing element decreases the farther the pixel is positioned from the center of the solid-state image sensing element, and of such shape and light-gathering power as to gather light entering from the microlens substantially entirely within the area of said photoelectric conversion unit.

11. The solid-state image sensing element according to claim 10, wherein:
said microlens is disposed so as to be offset toward the center of the solid-state image sensing element with respect to the optical axis of said photoelectric conversion unit depending on the position of a corresponding pixel in relation to the center of the solid-state image sensing element; and
said light-directing unit has an opening that accommodates substantially all the light from said microlens.

* * * * *